(12) United States Patent
Onishi et al.

(10) Patent No.: US 6,392,413 B2
(45) Date of Patent: May 21, 2002

(54) SHORT CIRCUIT INSPECTION METHOD FOR BATTERY AND METHOD OF MANUFACTURING BATTERIES

(75) Inventors: Masato Onishi, Toyohashi; Hideo Asaka, Kosai; Katsuyuki Tomioka, Toyohashi; Noriyuki Fujioka, Kosai, all of (JP)

(73) Assignees: Matsushita Electric Industrial Co., Ltd., Osaka; Toyota Jidosha Kabushiki Kaisha, Aichi, both of (JP)

( * ) Notice: Subject to any disclaimer, the term of this patent is extended or adjusted under 35 U.S.C. 154(b) by 0 days.

(21) Appl. No.: 09/788,536

(22) Filed: Feb. 21, 2001

(30) Foreign Application Priority Data

Feb. 22, 2000 (JP) ........................... 2000-044100

(51) Int. Cl.[7] ................................. G01N 27/416
(52) U.S. Cl. ............................... 324/429; 429/90
(58) Field of Search ..................... 324/426; 320/165, 320/DIG. 13; 429/90

(56) References Cited

U.S. PATENT DOCUMENTS 4,282,292 A 8/1981 Stewart

FOREIGN PATENT DOCUMENTS

| GB | 2013964 | 8/1979 |
|----|---------|--------|
| JP | 58-35878 | 3/1983 |
| JP | 4-138674 | 5/1992 |
| JP | 11-40210 | 2/1999 |

OTHER PUBLICATIONS

English Language Abstract of JP 4–138674.

English Language Abstract of JP 11–40210.

English Language Abstract of JP 58–35878.

*Primary Examiner*—Gregory J Toatley
(74) *Attorney, Agent, or Firm*—Greenblum & Bernstein, P.L.C.

(57) ABSTRACT

In a method of inspecting batteries for short circuit failures, an electrode plate group 1 composed of positive and negative electrode plates 2, 3 with intervening separators 4 interposed therebetween is set on a pressing station 7, where it is compressed during short-circuiting inspection is performed, for simulating a state wherein separators are compressed by swelling electrode plates 2, 3 during charging and discharging of battery.

7 Claims, 2 Drawing Sheets

SHORT CIRCUIT INSPECTION METHOD FOR BATTERY AND METHOD OF MANUFACTURING BATTERIES

BACKGROUND OF THE INVENTION

The present disclosure relates to subject matter contained in priority Japanese Patent Application No. 2000-044100, filed on Feb. 22, 2000, the contents of which is herein expressly incorporated by reference in its entirety.

1. Field of the Invention

The present invention relates to a method of inspecting batteries for a short circuit and to a method of manufacturing batteries.

2. Description of Related Art

Batteries including a number of positive electrodes and negative electrodes with intervening separator therebetween are subject to inspection for a short-circuit failure. FIG. 3 illustrates a prior art arrangement for one such inspection method for batteries. In the drawing, reference numeral 21 denotes an electrode plate group composed of a plurality of positive electrodes 22 and a plurality of negative electrodes 23 laminated upon one another with separators 24 interposed therebetween. The electrode plate group 21 is housed within a battery case 25. An insulation resistance tester 27 is connected across the battery case 25 with which the negative electrodes 23 are in contact and a positive electrode terminal 26 connected to one of the positive electrode plates 22 in the middle. The presence or absence of short circuit is thus determined by measuring the insulation resistance across the opposite electrode terminals.

Another example disclosed, for example, in Japanese Laid-open Patent Application No. 4-138674 is an inspection apparatus connected to a pair of pushing bars for inserting an electrode plate group into a battery case, in which voltage is applied across the pair of pushing bars during or immediately after insertion of the electrode plate group into the battery case.

Yet another example disclosed, for example, in Japanese Laid-open Patent Application No. 11-40210 involves applying high voltage across the positive and negative electrodes of an electrode plate group housed within a battery case, prior to injection of electrolyte. The electrode plate group is thus inspected for short circuits by detecting a voltage drop due to short-circuiting current. By this method, it is also possible to identify the regions where there is a risk of light short-circuiting.

The method illustrated in FIG. 3, wherein the insulation resistance of the electrode plate group 21 is measured in a state where the electrode plate group 21 is housed inside a battery case 25, had the following problem. After the battery has been charged and discharged, swelling occurs in the electrode plates, whilst the electrode plate group 21 is constrained by the battery case 25, and therefore the separators 24 interposed between the electrode plates 22, 23 are compressed by the electrode plates 22, 23. As a result, there was the risk that short-circuiting occurs after charging and discharging of the battery, due to conductive foreign matters which existed between the electrode plates 22, 23 and the separators 24, or due to burrs on the electrode plates 22, 23 which may pierce through the separators 24. Consequently, it is often the case that a battery, which has been determined as satisfactory by the inspection prior to injection of electrolyte into the battery case, will produce short circuit faults after charging and discharging of the battery.

To solve this problem, batteries are subject to aging after initial charging and discharging, so as to detect and eliminate defective products. However, this requires a long time for inspection and also high costs, since the entire process for inspection including aging with respect to defective products which are included in the complete batteries is a complete waste.

Another problem with the method wherein insulation resistance is measured is that it is susceptible to the effects of ambient humidity, resulting in false judgements regarding the presence of short circuits. The method is therefore hardly applicable to the short-circuiting inspection for batteries having a high output design.

With the inspection method disclosed in Japanese Laid-open Patent Application No. 4-138674, productivity is improved by performing inspection simultaneously with the process step for inserting electrode plate groups into battery cases. However, the method provides no solution to the above-mentioned problem that some of the complete batteries turn out to be defective later due to swelling of electrode plates. The inspection method disclosed in Japanese Laid-open Patent Application No. 11-40210 has an advantage that even the regions which are likely to produce light short circuits after a while can be identified, but it gives no assurance that no short-circuiting occurs after the complete battery undergoes charging and discharging.

SUMMARY OF THE INVENTION

With the foregoing problems of the prior art in view, it is an object of the present invention to provide a battery inspection method, whereby a battery in which short-circuiting may occur after charging and discharging of the battery due to swelling of electrode plates is detected without failure, and a battery manufacturing method wherein such inspection method is incorporated.

The present invention is a method of inspecting batteries for a short-circuiting failure, including the steps of:

laminating a plurality of positive electrode plates and a plurality of negative electrode plates alternately with intervening separators therebetween for constituting an electrode plate group; and compressing the electrode plate group while inspecting the battery for a short circuit, prior to insertion of the electrode plate group into a battery case.

Electrode plates are compressed during the short-circuiting inspection, so as to simulate a state wherein the separators are compressed by swelling of the electrode plates after charging and discharging of batteries. Accordingly, although the inspection is performed prior to insertion of the electrode plates into the battery case, it is possible to detect a battery in which a short circuit may occur due to swelling of the electrode plates after charging and discharging of the battery.

The positive and negative electrode plates and separators may be vacuum dried before being assembled into the electrode plate group, so that the inspection is performed without being affected by ambient humidity.

The electrode plate group is compressed with such an amount of pressure that the separators are compressed to a dimension equal to a dimension to which the separators would be compressed after a predetermined number of cycles of charge and discharge of the battery. In this way, it is possible to remove batteries which may turn out to be defective after a while due to swelling of electrode plates, and reliability of the inspection is improved.

The battery is inspected for a short circuit by applying a predetermined voltage across the plurality of positive electrode plates and the plurality of negative electrode plates and by measuring electric current passing thereacross. In this way, potential causes of short circuit, such as minute foreign matters, burrs, or the like, are detected, and hence high reliability of inspection is achieved.

The voltage applied across the plurality of positive electrode plates and the plurality of negative electrode plates is set to a value that is lower than ⅔ of a threshold voltage of the compressed separators. In this way, inspection is strictly performed without causing damage to the electrode plate groups.

The present invention also provides a method of manufacturing batteries, including the steps of:

laminating a plurality of positive electrode plates and a plurality of negative electrode plates alternately with intervening separators therebetween for constituting an electrode plate group;

compressing the electrode plate group while inspecting the battery for a short circuit;

inserting an electrode plate group that has passed the inspection in the previous step into a battery case;

injecting electrolyte into the battery case; and sealing the battery.

The manufacturing method of the invention includes the battery inspection method described above, which is performed prior to insertion of the electrode plate group into the battery case, whereby a battery in which short-circuiting is likely to occur due to swelling of electrode plates after charging and discharging of the battery is detected and removed. Accordingly, the method enables production of reliable batteries with high efficiency.

The manufacturing method may further include a step of vacuum-drying the positive and negative electrode plates and separators before they are assembled into the electrode plate group. In this way, inspection of the battery is performed without being affected by ambient humidity.

While novel features of the invention are set forth in the preceding, the invention, both as to organization and content, can be further understood and appreciated, along with other objects and features thereof, from the following detailed description and examples when taken in conjunction with the attached drawings.

DESCRIPTION OF THE PREFERRED EMBODIMENTS

One embodiment of a battery short circuit inspection method and battery manufacturing method according to the present invention will be hereinafter described with reference to FIG. 1 and FIG. 2.

Figure 1:
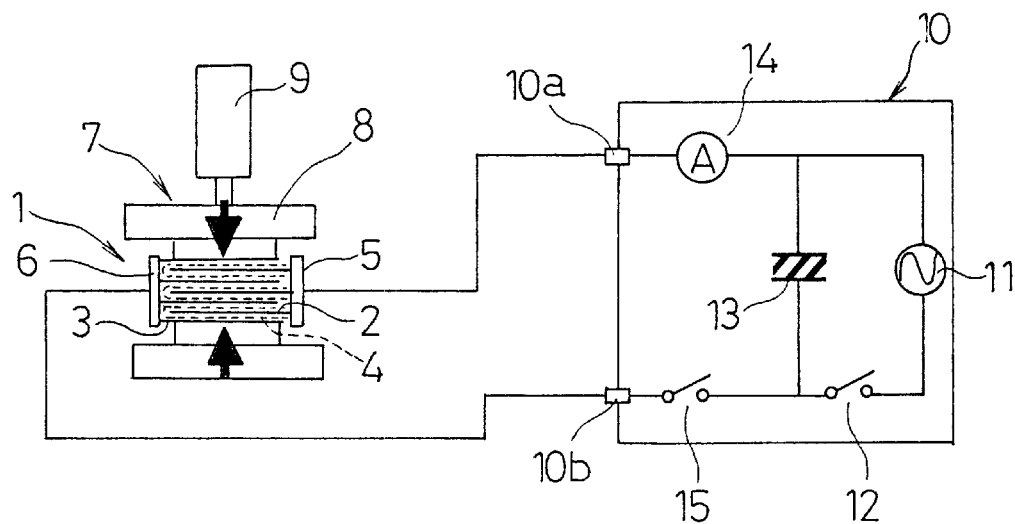
FIG. 1 is a schematic diagram showing the arrangement for one embodiment of a battery short circuit inspection method according to the present invention.
Figure 2:
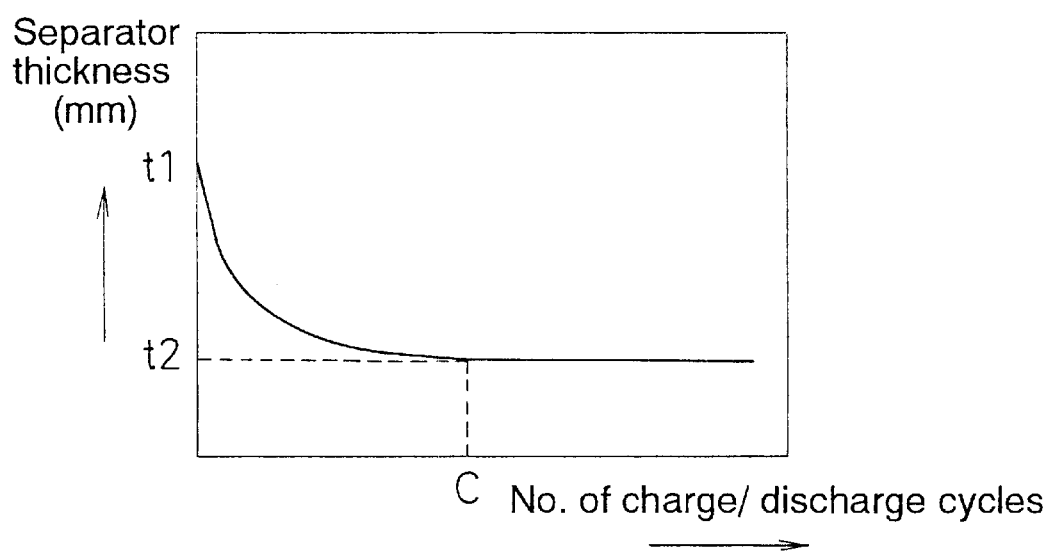
FIG. 2 is a graph illustrating change in separator thickness with the number of charge and discharge cycles of a battery.
Figure 3:
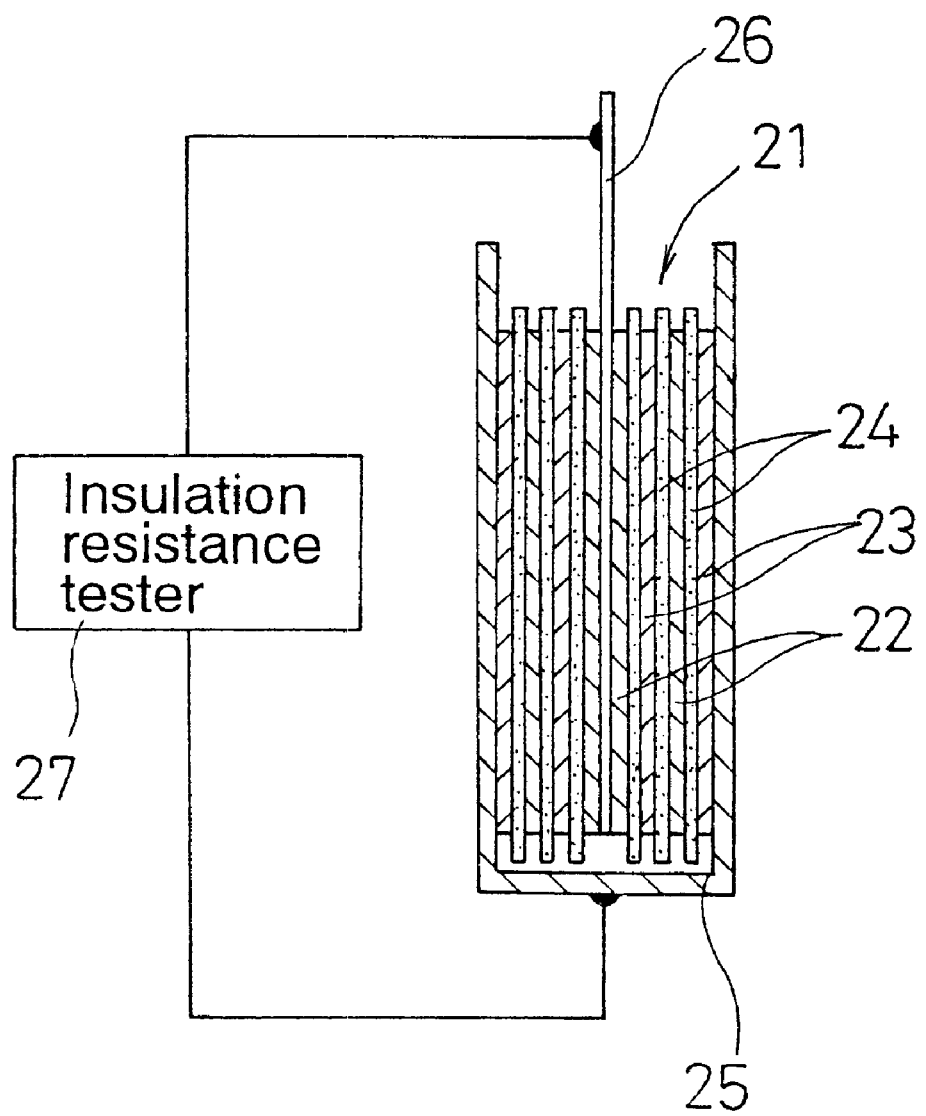
FIG. 3 is an illustrative diagram of a conventional battery short circuit inspection method.

In FIG. 1, reference numeral 1 denotes an electrode plate group for constituting a nickel metal hydride battery. The electrode plate group 1 includes a plurality of positive electrode plates 2 and a plurality of negative electrode plates 3 that are alternately laminated upon one another. The positive electrode plates 2 are covered with bag-shaped separators 4 having openings on one side, so that the separators 4 are interposed between each of the positive electrode plates 2 and negative electrode plates 3. Side edges on one side of the positive electrode plates 2 and those of the negative electrode plates 3 are protruded outwards in opposite directions, and these protruded side edges of the electrode plates constitute respective lead sections. Collector plates 5, 6 made of nickel sheet or nickel-plated steel sheet are abutted perpendicularly on the lead sections of the positive and negative electrode plates, respectively, and joined thereto by welding.

The positive electrode plates 2 are made of metal foam substrate containing Ni, and the lead sections of the positive electrode plates are composed of the protruded side edges of compressed metal foam substrate, to one side of which lead plates are welded by seam welding or ultrasonic welding. The negative electrode plates 3 are made of perforated metal substrate of Ni, coated with active materials in the form of a paste, and the lead sections of the negative electrode plates are composed of the protruded side edges of perforated metal substrate, which are not coated with the active material. The separators are composed of a 0.20 mm thick non-woven cloth in the shape of a bag. These positive electrode plates 2, negative electrode plates 3, and separators 4 are vacuum dried before they are assembled into the electrode plate group 1, so that the results of inspection in the subsequent process step are not affected by ambient humidity, for ensuring a high degree of inspection accuracy.

The electrode plate group 1 thus constructed is set in a pressing station 7 including a pressing jig 8 and a pressure applicator 9, such as a cylinder device, and the positive and negative collector plates 5, 6 are respectively connected to the output terminals 10$a$, 10$b$ of a short circuit inspection apparatus 10 for detecting short circuits in the electrode plate group 1.

The short circuit inspection device 10 includes a power source 11, a capacitor 13 connected to the power source 11 via a first switch 12, a current detector 14 connected between the capacitor 13 and one output terminal 10$a$, and a switch 15 connected between the capacitor 13 and the other output terminal 10$b$.

A load of approximately 4000 N is applied to the electrode plate group 1 at the pressing station 7, for the purpose of compressing the thickness of the separators to a predetermined value. This amount of compression of the separators is based on the value obtained empirically through repeated charging and discharging of battery. It is known that the thickness of the separators 4 is progressively decreased from the initial thickness t1 with repeated charging and discharging of the battery, and stabilizes at t2, after the battery has been used for a predetermined number of cycles, as illustrated in FIG. 2. Generally, the thickness of separators, which had an initial thickness t1 of about 0.20 mm, stabilizes at a value t2 of about 0.13 mm when the number of charge and discharge cycles C of the battery has reached 100.

In the state wherein pressure is applied to the electrode plate group 1, the second switch 15 of the short circuit inspection device 10 is opened, while the first switch 12 is closed for charging the capacitor 13. When charging is finished, the first switch 12 is opened and the second switch 15 is closed, voltage of 400 V is applied to the electrode plate group 1, and the electric current passing through the circuitry is measured by the current detector 14. Since no current should flow if the electrode plate group 1 is free of short circuits, and hence the presence of short circuits is accurately determined.

The electrode plate group 1 that has passed this short-circuit test is then accommodated inside a prismatic battery case having an opening in the upper end thereof (not illustrated), along with electrolyte solution, and the upper end opening of the battery case is sealed by a lid member (not illustrated), thereby completing a battery.

According to this method, as described above, electrode plate groups 1 are compressed during the short-circuiting inspection, so as to simulate a state wherein the separators 4 are compressed by swelling of the electrode plates 2, 3 after charging and discharging of batteries. Accordingly, although the inspection is performed prior to insertion of the electrode plate groups into battery cases, it is possible to detect a battery in which a short circuit may occur due to swelling of the electrode plates 2, 3 after charging and discharging of the battery, whereby defective products are reliably eliminated. The electrode plate groups 1 are compressed with such an amount that the separators 4 will decrease in thickness to a predetermined value as they would in batteries which have been used for a predetermined number of charge and discharge cycles. In this way, reliability of the inspection is enhanced, and it is prevented that a battery defect occurs at a substantially later time due to swelling of the electrode plates 2, 3.

Since the voltage is applied across the positive and negative electrodes of the electrode plate group 1 through the capacitor 13 when measuring the passing electric current by the current detector 14, it is possible to detect even potential causes of short circuits, such as minute impurities, burrs, or the like, and hence high inspection reliability is achieved. In particular, voltage applied for inspection is set to a high voltage of approximately 400 V, which is lower than and proximate to $2/3$ of the threshold voltage of the compressed separators 4. In this way, inspection is strictly performed without causing damage to the electrode plate groups, and thus inspection reliability is improved.

With the short-circuiting inspection method of the invention described above being incorporated into manufacture of batteries, all potentially defective batteries, in which short circuits can be formed due to swelling of electrode plates 2, 3 after repeated charging and discharging of the batteries, are removed. Accordingly, the battery inspection method of the invention enables production of reliable batteries with good efficiency.

The benefits of the invention were confirmed by comparison of the short-circuiting detection rate at the time of inspection according to the short-circuiting inspection method of the invention, and the fault rate of batteries after use of 1000 cycles of charge and discharge, with those in accordance with a conventional method. The results of comparison are summarized in Table 1.

TABLE 1

|  | Short-circuiting detection rate at the time of inspection | Fault rate of batteries after 1000 cycles of charge/discharge |
| --- | --- | --- |
| Present Invention | 350 | 38 |
| Prior Art | 100 | 100 |

The short-circuiting inspection method of the invention exhibited an index of 350 in comparison to the value of 100 in accordance with the conventional inspection method, for the detection rate of short circuit failure at the time of inspection. Also, the inspection method of the invention exhibited an index of 38, in comparison to 100 for the conventional method, for the battery failure after use of 1000 cycles of charge and discharge.

It can be seen that the short circuit inspection method of the invention enables detection of failure at a much higher rate at the time of inspection, as a result of which the fault rate of batteries afterwards is much decreased. It is thus ascertained that the present invention method ensures prevention of short circuit failure in batteries.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. A method of inspecting batteries for a short-circuiting failure, comprising the steps of:

laminating a plurality of positive electrode plates and a plurality of negative electrode plates alternately with intervening separators therebetween for constituting an electrode plate group; and compressing said electrode plate group while inspecting the battery for a short circuit, prior to insertion of said electrode plate group into a battery case.

2. The method of inspecting batteries for a short-circuiting failure according to claim 1, wherein said plurality of positive and negative electrode plates and said separators are vacuum dried before being assembled into said electrode plate group.

3. The method of inspecting batteries for a short-circuiting failure according to claim 1, wherein said electrode plate group is compressed with such an amount of pressure that said separators are compressed to a dimension equal to a dimension to which the separators would be compressed after a predetermined number of cycles of charge and discharge of the battery.

4. The method of inspecting batteries for a short-circuiting failure according to claim 1, wherein said battery is inspected for a short circuit by applying a predetermined voltage across said plurality of positive electrode plates and said plurality of negative electrode plates and by measuring electric current passing thereacross.

5. The method of inspecting batteries for a short-circuiting failure according to claim 4, wherein the voltage applied across said plurality of positive electrode plates and said plurality of negative electrode plates is set to a value that is lower than $2/3$ of a threshold voltage of the compressed separators.

6. A method of manufacturing batteries, comprising the steps of:

laminating a plurality of positive electrode plates and a plurality of negative electrode plates alternately with intervening separators therebetween for constituting an electrode plate group;

compressing said electrode plate group while inspecting the battery for a short circuit;

inserting an electrode plate group that has passed said inspection in the previous step into a battery case;

injecting electrolyte into the battery case; and sealing the battery.

7. The method of manufacturing batteries according to claim 6, further comprising a step of vacuum-drying the plurality of positive and negative electrode plates and the separators before they are laminated into the electrode plate group.

* * * * *